United States Patent
Kim

(10) Patent No.: US 8,633,533 B2
(45) Date of Patent: Jan. 21, 2014

(54) SEMICONDUCTOR INTEGRATED CIRCUIT HAVING CAPACITOR FOR PROVIDING STABLE POWER AND METHOD OF MANUFACTURING THE SAME

(75) Inventor: Jong Su Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 13/340,847

(22) Filed: Dec. 30, 2011

(65) Prior Publication Data

US 2013/0026549 A1 Jan. 31, 2013

(30) Foreign Application Priority Data

Jul. 27, 2011 (KR) .................. 10-2011-0074469

(51) Int. Cl.
*H01L 27/108* (2006.01)
*H01L 21/20* (2006.01)

(52) U.S. Cl.
USPC ............ 257/300; 257/E29.345; 257/E21.008; 438/396

(58) Field of Classification Search
CPC .. H01L 27/10852; H01L 27/108; H01L 28/90
USPC .................. 257/290, 300, E29.345, E21.008; 438/381, 393, 396
See application file for complete search history.

(56) References Cited

U.S. PATENT DOCUMENTS 6,448,599 B1 * 9/2002 Wang ............................ 257/300

* cited by examiner

*Primary Examiner* — Nikolay Yushin
(74) *Attorney, Agent, or Firm* — William Park & Associates Patent Ltd.

(57) ABSTRACT

A capacitor and a method of manufacturing the same are provided. A dummy capacitor group is formed in the peripheral circuit area and includes a dummy storage node contact unit, a dielectric, and a dummy plate electrode. A metal oxide semiconductor (MOS) capacitor is formed in the peripheral circuit area and connected to the dummy capacitor group in parallel. Capacitance of the dummy capacitor group may be greater than that of the MOS capacitor.

18 Claims, 5 Drawing Sheets

SEMICONDUCTOR INTEGRATED CIRCUIT HAVING CAPACITOR FOR PROVIDING STABLE POWER AND METHOD OF MANUFACTURING THE SAME

CROSS-REFERENCES TO RELATED APPLICATION

The present application claims priority under 35 U.S.C. 119(a) to Korean application number 10-2011-0074469, filed on Jul. 27, 2011, in the Korean Patent Office, which is incorporated by reference in its entirety.

BACKGROUND OF THE INVENTION

1. Technical Field

The inventive concept relates to a semiconductor integrated circuit and a method of manufacturing the same, and more particularly, to a semiconductor integrated circuit having capacitor for providing stable power and a method of manufacturing the same.

2. Related Art

High integration, low voltage, and high speed are key parameters to estimate performance of semiconductor integrated circuits. Such a semiconductor integrated circuit has required low voltage and also power having multiple levels. As is well-known, when power supplied to the semiconductor integrated circuit necessarily involves some noise. The noise can affect signal transfer characteristics of a device, that is, introduce a delay value.

In recent years, a capacitor has been introduced for removing power noise, for example, a reservoir capacitor is formed in a peripheral circuit area of the semiconductor integrated circuit.

The capacitor for removing noise is configured by stacking a conductive layer, a dielectric layer, and a conductive layer in an empty space of the peripheral circuit area of sufficient capacitance to provide stable power.

SUMMARY

According to one aspect of an exemplary embodiment, a semiconductor integrated circuit includes a peripheral circuit area where a dummy capacitor group is formed including a dummy storage node contact unit, a dielectric, and a dummy plate electrode. A metal oxide semiconductor (MOS) capacitor is also formed in the peripheral circuit area and connected to the dummy capacitor group in parallel. The dummy storage node contact unit and the dummy plate electrode are configured such that different voltage levels are provided to them. Capacitance of the dummy capacitor group may be greater than that of the MOS capacitor.

According to another aspect of an exemplary embodiment, a semiconductor integrated circuit includes a first dummy capacitor group including a first storage node contact unit, a first dielectric, and a plate electrode, a second dummy capacitor group including the plate electrode, a second dielectric, and a second storage node contact unit, and a MOS capacitor including a first electrode connected to the first storage node contact unit and a second electrode connected to the second storage node contact unit. The first storage node contact unit may have an opposite potential to the second storage node contact unit.

According to still another aspect of an exemplary embodiment, a method of manufacturing a semiconductor integrated circuit includes preparing a semiconductor substrate to have a peripheral circuit area and a cell area, forming a MOS capacitor including a first electrode and a second electrode in the peripheral circuit area of the semiconductor substrate in a same process used to form a MOS transistor in a cell area. A first dummy storage node contact unit is formed such that it is electrically connected to the first electrode of the MOS capacitor and a second dummy storage node contact unit is formed such that it is electrically connected to the second electrode of the MOS capacitor, where the MOS capacitor is formed in a same process used to form a storage node contact unit in each cell array region of the cell area. A first dielectric layer, a second dielectric layer, and a third dielectric layer are formed on the first and second dummy storage node contact units and the storage node contact unit, respectively, and a dummy plate electrode is formed on the first and second dielectric layers in a same process used to form a cell plate electrode on the third dielectric layer.

These and other features, aspects, and embodiments are described below in the section entitled "DESCRIPTION OF EXEMPLARY EMBODIMENTS."

BRIEF DESCRIPTION OF THE DRAWINGS

The above and other aspects, features, and advantages of the subject matter of the present disclosure will be more clearly understood from the following detailed description taken in conjunction with the accompanying drawings, in which.

DESCRIPTION OF EXEMPLARY EMBODIMENT

Figure 1:
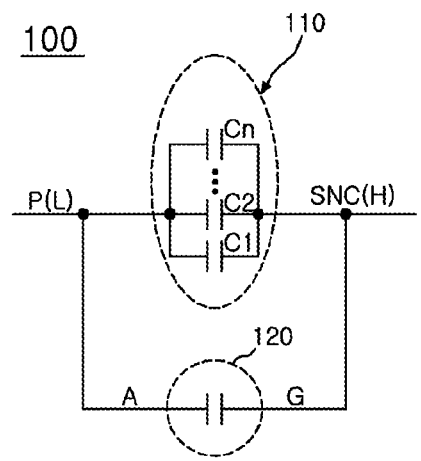
FIG. 1 is a circuit diagram illustrating a semiconductor integrated circuit including a capacitor according to an exemplary embodiment of the inventive concept.

Exemplary embodiments will be described in greater detail with reference to the accompanying drawings.

Exemplary embodiments are described with reference to schematics and cross-sectional illustrations. Accordingly, variations from the illustrations as a result of manufacturing techniques and/or tolerances, for example, are to be expected. Thus, exemplary embodiments should not be construed as being limited to the particular shapes of regions illustrated herein but may be understood to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer, or intervening layers may also be present.

Figure 2:
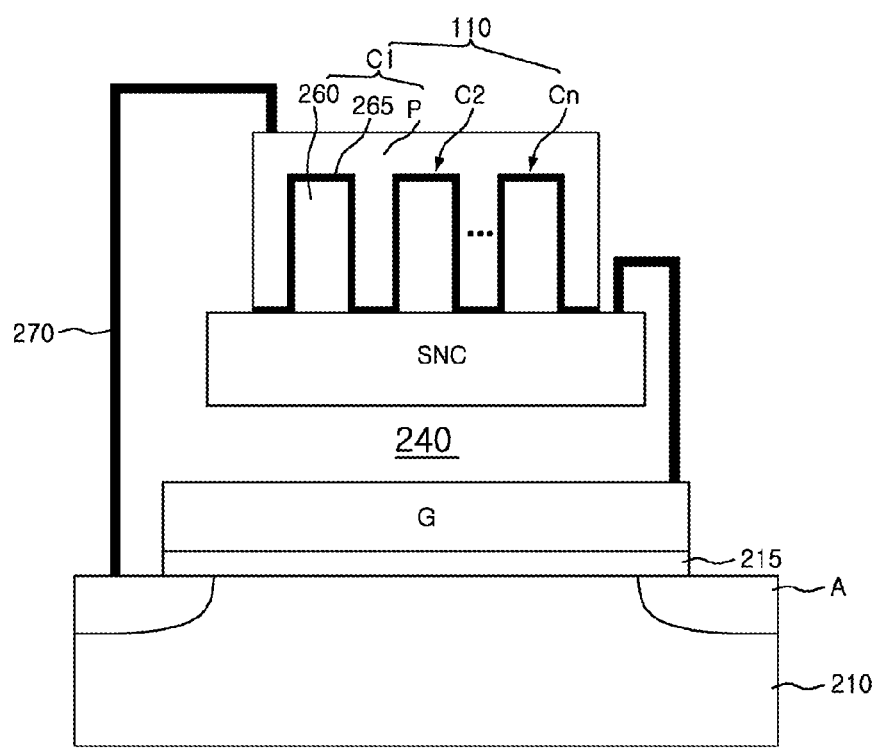
FIG. 2 is a cross-sectional view illustrating a semiconductor integrated circuit according to an exemplary embodiment of the inventive concept.

FIG. 1 is a circuit diagram illustrating a semiconductor integrated circuit including a capacitor according to an exemplary embodiment of the inventive concept, and FIG. 2 is a cross-sectional view illustrating a semiconductor integrated circuit according to an exemplary embodiment of the inventive concept.

Referring to FIGS. 1 and 2, a capacitor 100 formed in a peripheral circuit area for providing stable power may include a dummy cell capacitor group 110 and a metal oxide semiconductor (MOS) capacitor 120.

The dummy cell capacitor group 110 may include a plurality of dummy capacitors C1, C2 . . . Cn connected in parallel between a dummy plate electrode P and a dummy storage node contact unit SNC. The dummy plate electrode P and the dummy storage node contact unit SNC may be disposed in the peripheral circuit area and may be simultaneously formed in the same shape as a plate electrode (not shown) and a storage node contact unit (not shown) formed in a cell area.

The MOS capacitor 120 may have a shape of a MOS transistor. A gate G of the MOS capacitor 120 may be electrically connected to the dummy storage node contact unit SNC and an active region A of the MOS capacitor 120 may be electrically connected to the dummy plate electrode P. Different voltages may be applied to the dummy plate electrode P and the dummy storage node contact unit SNC.

The term "electrical connection" may be interpreted as electrical contact. In FIG. 2, the reference numeral 215 denotes a gate insulating layer interposed between the gate G and a semiconductor substrate 210. The reference numeral 240 denotes an interlayer insulating layer that insulates the gate G from the dummy storage node contact unit SNC. The reference numeral 270 indicates an electrical interconnection. Although not shown in drawings, a bit line may be formed within the interlayer insulating layer 240.

In this exemplary embodiment, a capacitor for removing noise is simultaneously fabricated in a portion of the peripheral circuit area during a MOS transistor fabrication process and a capacitor fabrication process in the cell area. Accordingly, it is possible to fabricate the cell capacitor-graded capacitor for removing noise in the peripheral circuit area having a relatively large area margin without an additional process and thus it is possible to supply stable power.

Furthermore, the capacitor for removing noise is integrated in the peripheral circuit area where most of power sources are integrated so that a removal efficiency of noise can be greater.

Figure 3:
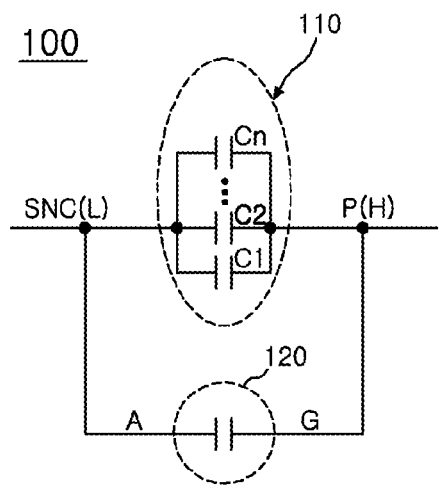
FIG. 3 is an equivalent circuit diagram illustrating a semiconductor integrated circuit according to another exemplary embodiment of the inventive concept.
Figure 4:
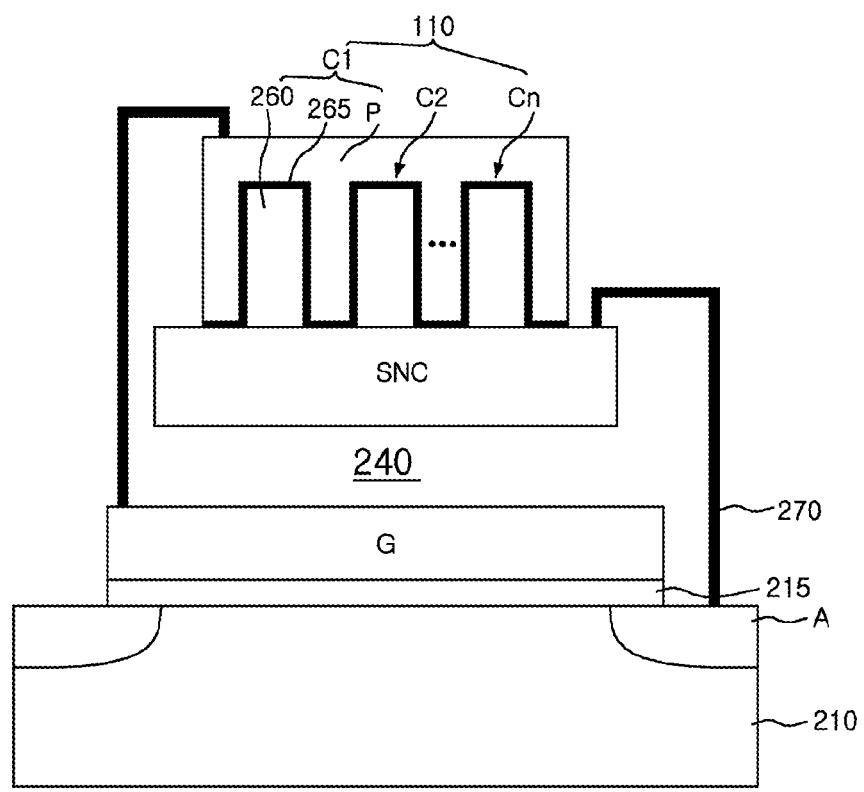
FIG. 4 is a cross-sectional view illustrating a semiconductor integrated circuit according to another exemplary embodiment of the inventive concept.

In the above exemplary embodiment, the gate G of the MOS capacitor 120 is connected to the dummy storage node contact unit SNC and the active area A of the MOS capacitor 120 is connected to the dummy plate electrode P. Moreover, various embodiments of the invention may comprise a structure shown in FIGS. 3 and 4 where a gate G of the MOS capacitor 120 is connected to a dummy plate electrode P and an active region A of the MOS capacitor 120 is connected to the dummy storage node contact unit SNC. The structure shown in FIGS. 3 & 4 may have the same functionality as the structure of FIGS. 1 and 2.

Figure 5:
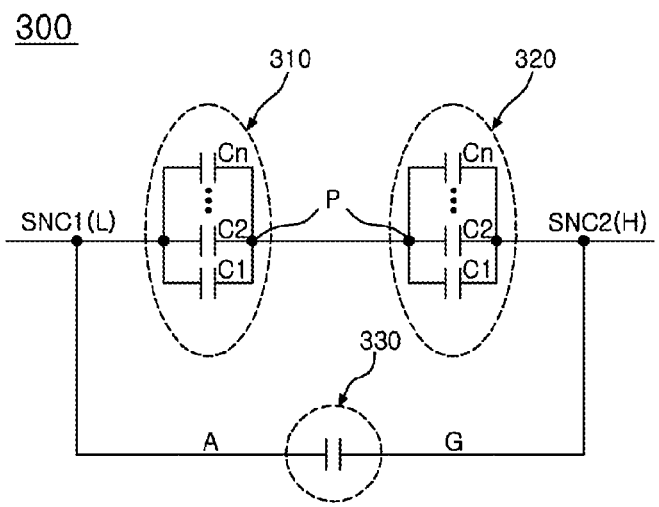
FIG. 5 is a circuit diagram illustrating a semiconductor integrated circuit according to another exemplary embodiment of the inventive concept.
Figure 6:
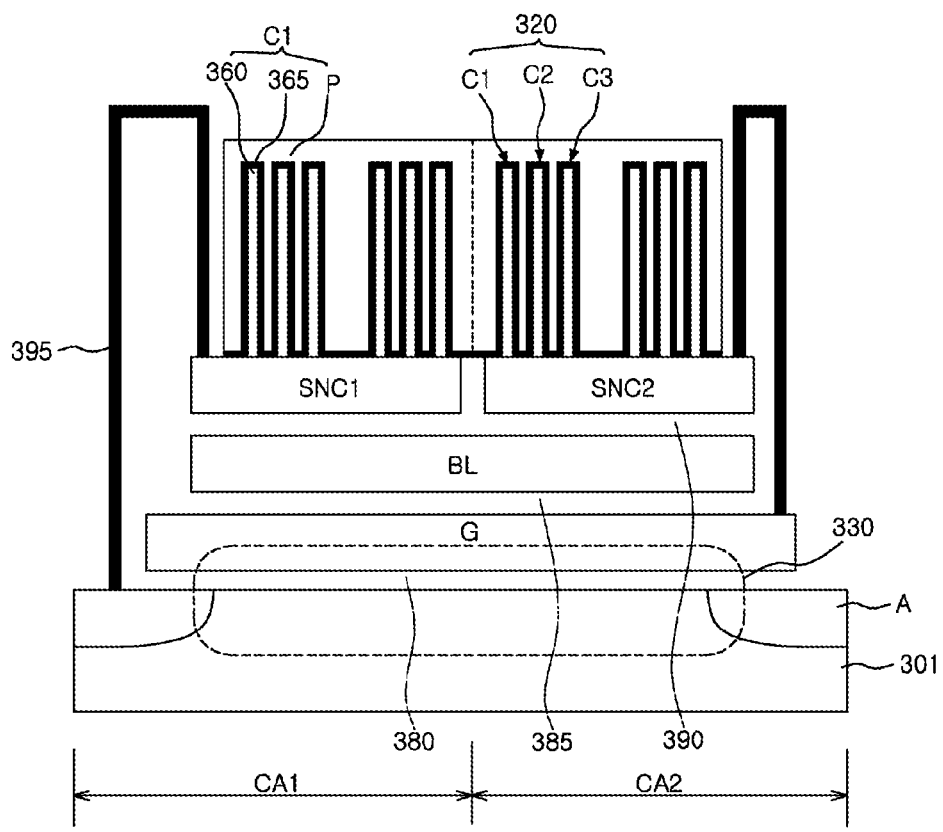
FIG. 6 is a cross-sectional view illustrating a semiconductor integrated circuit according to another exemplary embodiment of the inventive concept.

FIG. 5 is a circuit diagram illustrating a semiconductor integrated circuit according to another exemplary embodiment of the inventive concept, and FIG. 6 is a cross-sectional view illustrating a semiconductor integrated circuit according to another exemplary embodiment of the inventive concept.

Referring to FIGS. 5 and 6, a capacitor 300 includes a first dummy capacitor group 310, a second dummy capacitor group 320, and a MOS capacitor 330.

The first dummy capacitor group 310 may be connected between a first dummy storage node contact unit SNC1 and a dummy plate electrode P and may include a plurality of dummy capacitors C1, C2 . . . Cn connected in parallel.

The second dummy capacitor group 320 may be connected between a second dummy storage node contact unit SNC2 and the dummy plate electrode P and may include a plurality of dummy capacitors C1, C2 . . . Cn connected in parallel.

The MOS capacitor 330 may be connected between the first dummy storage node contact unit SNC1 and the second dummy storage node contact unit SNC2. An active region A of the MOS capacitor 330 is connected to the first dummy storage node contact unit SNC1 and a gate G of the MOS capacitor 330 is connected to the second dummy storage node contact unit SNC2. The gate G constituting the MOS capacitor 330 is formed over regions in which the first and second storage node contact units SNC1 and SNC2 are formed so that the MOS capacitor 330 can have larger capacitance than the MOS capacitor 120 shown above.

Each of the first and second dummy storage node contact units SNC1 and SNC2 may be formed on each cell array region CA1 and CA2 (or each cell mat) where they are separate from each other. That is, a size of one dummy storage node contact unit SNC1 or SNC2 may correspond to a size of one cell array region CA1 or CA2 or a size of one cell mat. In addition, a plurality of dummy storage node electrodes 360, for example, corresponding to the number of storage node electrodes formed in the one cell array region CA1 or CA2 may be included on the first or second dummy storage node contact unit SNC1 or SNC2 to form the plurality of dummy capacitors C1, C2 . . . Cn.

Since the active region A of the MOS capacitor 330 is connected to the first dummy storage node contact unit SNC1 and the gate G of the MOS capacitor 330 is connected to the second dummy storage node contact unit SNC2, a predetermined potential difference may be applied to the first and second dummy storage node contact units SNC1 and SNC2 so that charge and discharge may occur between two electrodes constituting the MOS capacitor 330. The predetermined potential difference may be, for example, potentials having opposite levels.

Here, the reference numeral 301 denotes a semiconductor substrate and BL denotes a bit line. In addition, the reference numeral 380 denotes a gate insulating layer interposed between the gate G and the active region A, 385 and 390 denote interlayer insulating layers, and 395 denotes a metal interconnection.

As described above, two dummy capacitor groups 310 and 320 are connected in series so that a capacitor having a larger capacitance can be fabricated.

Figure 7:
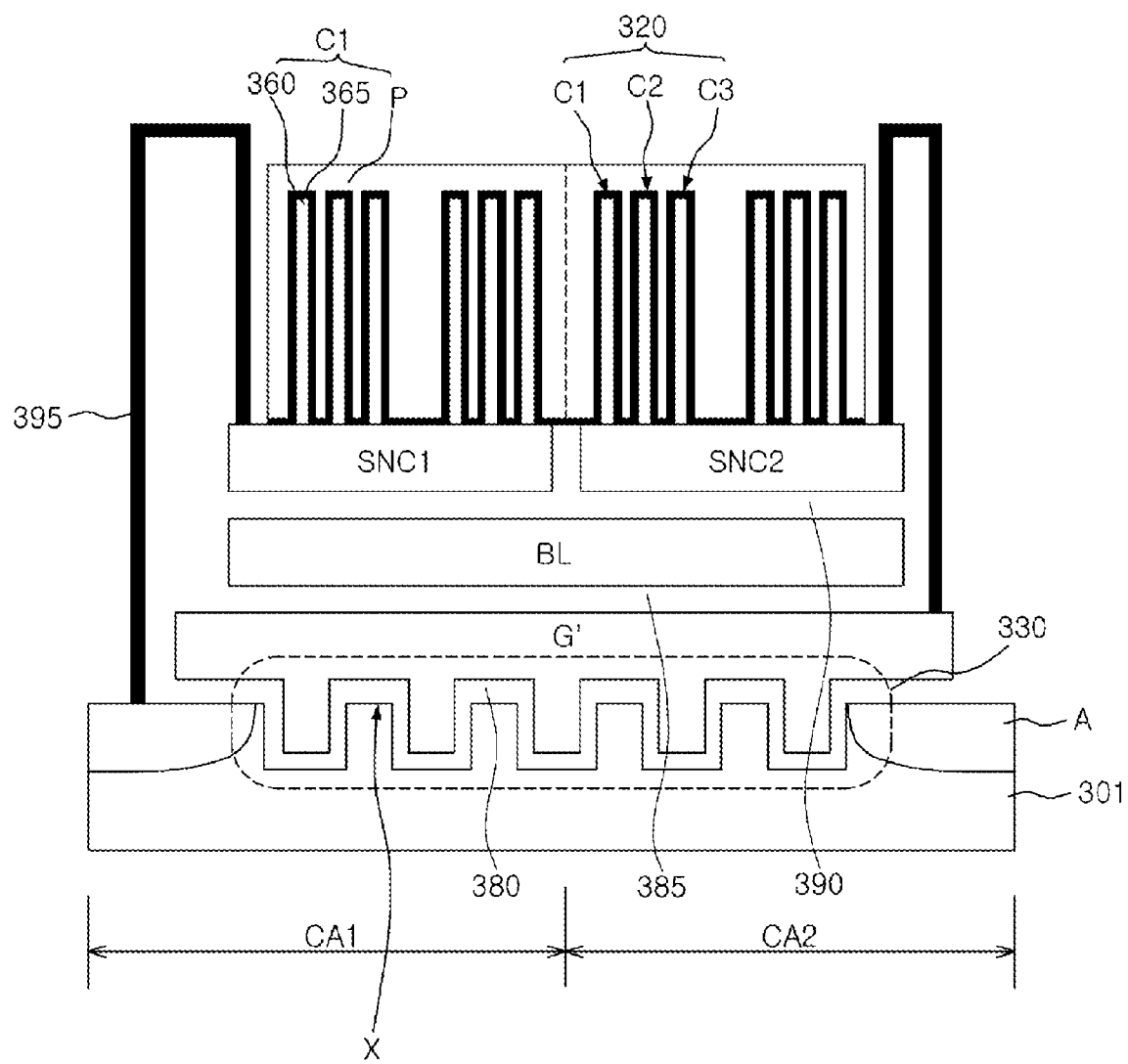
FIG. 7 is a cross-sectional view illustrating a semiconductor integrated circuit according to another exemplary embodiment of the inventive concept.

As shown in FIG. 7, to ensure more capacitance for the MOS capacitor 330, curves are formed in a contact surface between a gate electrode G' and a gate insulating layer 380 to increase a surface area of an electrode. The curve X may be formed through a pretreatment process such as an ion implantation and oxidation process before the gate insulating layer 380 is formed. Therefore, a surface area of the gate G' for the MOS capacitor 330 is increased to ensure larger capacitance.

Figure 8:
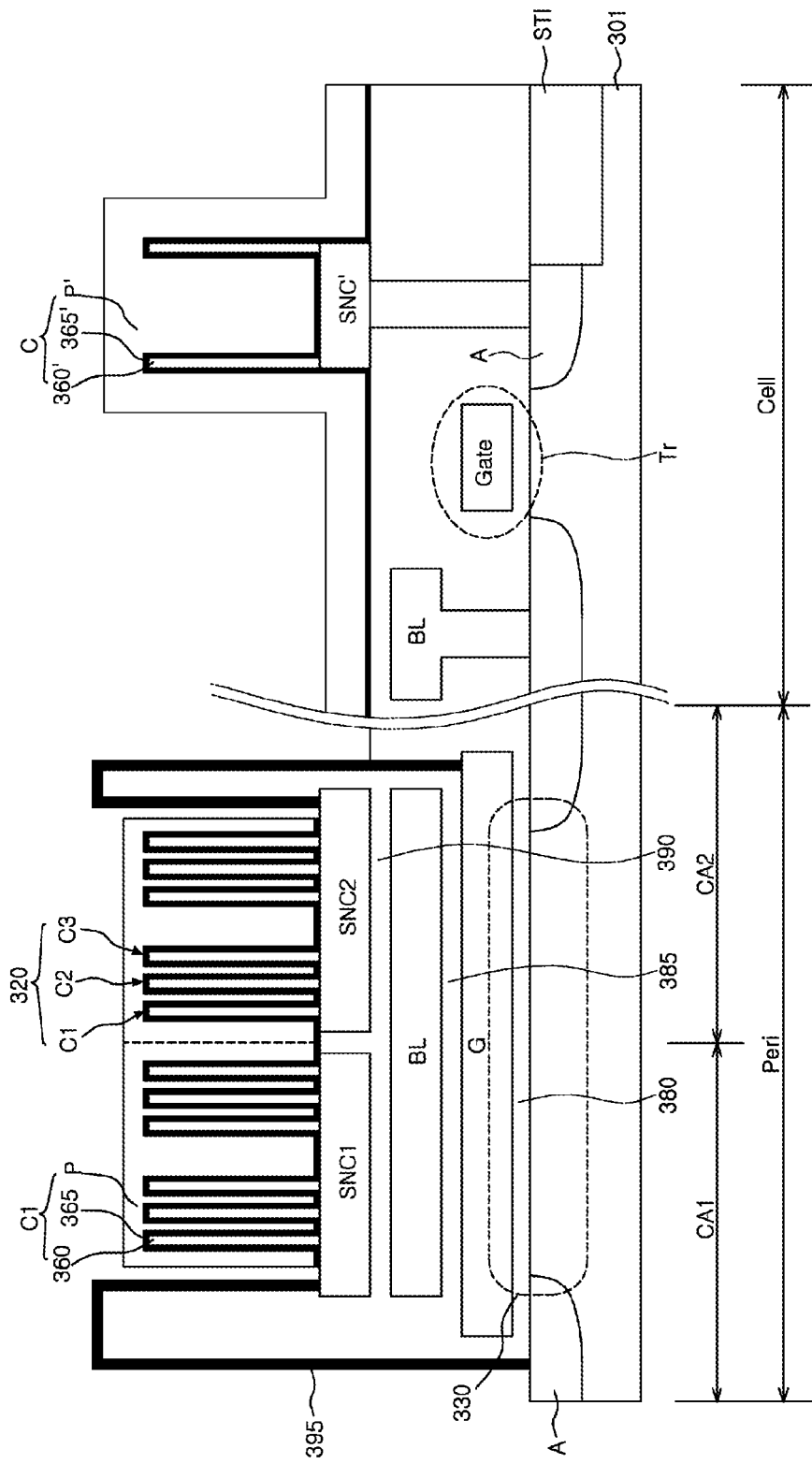
FIG. 8 is a cross-sectional view illustrating a semiconductor integrated circuit in which devices formed in a peripheral circuit area and in a cell area are formed according to another exemplary embodiment of the inventive concept.

FIG. 8 is a cross-sectional view illustrating a peripheral circuit area and a cell area of a semiconductor integrated circuit according to another exemplary embodiment of the inventive concept.

Referring to FIG. 8, a MOS capacitor 330 of a peripheral circuit area Peri is simultaneously formed with a MOS transistor Tr of a cell area Cell so that the MOS capacitor 330 is positioned at the same plan as the MOS transistor Tr. A bit line BL is then formed in the peripheral circuit area Peri and the cell area Cell. In some cases, the bit line BL of the peripheral circuit area Peri may be omitted.

First and second dummy storage node contact units SNC1 and SNC2 are formed in the peripheral circuit area Peri and simultaneously a storage node contact unit SNC' is formed in the cell area Cell. The dielectric layers 365 and 365' are formed on a resultant structure of a semiconductor substrate 301 in which the dummy storage node contact units SNC1 and SNC2 and the storage node contact unit SNC' are formed. Plate electrodes P and P' are formed on the dielectric layers 365 and 365', respectively.

Thus, the reservoir capacitor having substantially the same capacitance as in the cell area can be fabricated in the peripheral circuit area with a general fabrication process of a memory device.

According to an exemplary embodiment, the cell capacitors having a cell area-graded capacitance are fabricated in the peripheral circuit area so that all the cell capacitors may be used as the reservoir capacitors. Thus, capacitance of μF grade corresponding to cell array capacitance can be ensured and when providing power, noise and power mesh characteristics can be improved.

According to the various exemplary embodiments, a capacitor having large capacitance of a cell capacitor level and the MOS capacitor can be formed without a separate process so that various capacitances can be ensured.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A semiconductor integrated circuit, comprising:
a dummy capacitor group formed on a peripheral circuit area and including a dummy storage node contact unit, a dielectric, and a dummy plate electrode; and
a metal oxide semiconductor (MOS) capacitor formed in the peripheral circuit area and connected to the dummy capacitor group in parallel,
wherein capacitance of the dummy capacitor group is greater than that of the MOS capacitor,
wherein the dummy capacitor group includes a plurality of dummy cell capacitors connected in parallel.

2. The semiconductor integrated circuit of claim 1, wherein the MOS capacitor includes:
a first electrode electrically connected to the dummy storage node contact unit;
a second electrode electrically connected to the dummy plate electrode; and
an insulating layer interposed between the first electrode and the second electrode.

3. The semiconductor integrated circuit of claim 2, wherein the first electrode of the MOS capacitor is an active region and the second electrode of the MOS capacitor is a gate.

4. The semiconductor integrated circuit of claim 2, wherein the first electrode of the MOS capacitor is a gate and the second electrode of the MOS capacitor is an active region.

5. The semiconductor integrated circuit of claim 1, wherein the dummy storage node contact unit of the dummy capacitor group includes a first storage node contact unit and a second storage node contact unit disposed separately from the first storage node contact unit.

6. The semiconductor integrated circuit of claim 5, wherein the dummy capacitor group includes:
a first dummy capacitor group including the first storage node contact unit, the dielectric, and the dummy plate electrode; and
a second dummy capacitor group including the second storage node contact unit, the dielectric, and the dummy plate electrode.

7. The semiconductor integrated circuit of claim 5, wherein the dummy capacitor group comprises cell capacitors formed in a cell area including a plurality of cell array regions adjacent to the peripheral circuit area.

8. The semiconductor integrated circuit of claim 7, wherein capacitance of the first dummy capacitor group corresponds to a total capacitance of the cell capacitors formed in any one cell array region among the plurality of cell array regions formed in the cell area.

9. A semiconductor integrated circuit, comprising:
a first dummy capacitor group including a first storage node contact unit, a first dielectric, and a plate electrode;
a second dummy capacitor group including the plate electrode, a second dielectric, and a second storage node contact unit; and
a metal oxide semiconductor (MOS) capacitor including a first electrode connected to the first storage node contact unit and a second electrode connected to the second storage node contact unit,
wherein at least one of the first dummy capacitor group and the second dummy capacitor group includes a plurality of dummy capacitors connected in parallel.

10. The semiconductor integrated circuit of claim 9, wherein the first and second dummy capacitor groups and the MOS capacitor are formed in a peripheral circuit area of a semiconductor substrate.

11. The semiconductor integrated circuit of claim 10, wherein the first and second dummy capacitor groups comprise cell capacitors formed in a cell area including a plurality of a cell array region adjacent to the peripheral circuit area.

12. The semiconductor integrated circuit of claim 11, wherein capacitance of at least one of the first and the second dummy capacitor group corresponds to a total capacitance of cell capacitors of any one cell array region among the plurality of cell array regions formed in the cell area.

13. The semiconductor integrated circuit of claim 9, wherein the first electrode of the MOS capacitor is a gate and the second electrode of the MOS capacitor is an active region.

14. The semiconductor integrated circuit of claim 9, wherein the MOS capacitor includes a recess gate that is not linear in shape.

15. The semiconductor integrated circuit of claim 9, wherein the first storage node contact unit has an opposite potential to the second storage node contact unit.

16. A method of manufacturing a semiconductor integrated circuit, comprising: forming a dummy capacitor group on a peripheral circuit area and including a dummy storage node contact unit, a dielectric, and a dummy plate electrode; and forming a metal oxide semiconductor (MOS) capacitor in the peripheral circuit area and connected to the dummy capacitor group in parallel, wherein capacitance of the dummy capacitor group is greater than that other MOS capacitor, and wherein the dummy capacitor group includes a plurality of dummy cell capacitors connected in parallel.

17. The method of claim 16, wherein the MOS capacitor includes: a first electrode electrically connected to the dummy storage node contact unit; a second electrode electrically connected to the dummy plate electrode; and an insulating layer interposed between the first electrode and the second electrode.

18. The method of claim 16, wherein the first electrode of the MOS capacitor is an active region and the second electrode of the MOS capacitor is a gate.

* * * * *